United States Patent [19]

Yoshino

[11] Patent Number: 5,140,181
[45] Date of Patent: Aug. 18, 1992

[54] REFERENCE VOLTAGE SOURCE CIRCUIT FOR A DARLINGTON CIRCUIT

[75] Inventor: Hiroshi Yoshino, Yokohama, Japan

[73] Assignee: Kabushiki Kaisha Toshiba, Kawasaki, Japan

[21] Appl. No.: 718,976

[22] Filed: Jun. 21, 1991

[30] Foreign Application Priority Data

Jun. 22, 1990 [JP] Japan .................................. 2-164563

[51] Int. Cl.$^5$ .............................................. H03K 3/01
[52] U.S. Cl. ................................. 307/296.1; 307/296.6; 307/315
[58] Field of Search ................... 307/296.1, 296.6, 490, 307/315; 330/296

[56] References Cited

U.S. PATENT DOCUMENTS 4,066,914  1/1978  Gundry ............................. 307/296.1
4,506,208  3/1985  Nagano ............................. 307/296.6

*Primary Examiner*—Stanley D. Miller
*Assistant Examiner*—Toan Tran
*Attorney, Agent, or Firm*—Finnegan, Henderson, Farabow, Garrett and Dunner

[57] ABSTRACT

According to this invention, the emitters of the transistors constituting a differential amplifier are biased by a constant current source. A current mirror circuit is connected to the collectors of the transistors constituting the differential amplifier. A reference potential circuit for generating a reference potential is connected to the base of one of the transistors constituting the differential amplifier, and an output current from the current mirror circuit is fed back to the base of the other transistor. Therefore, the reference potential generated from the reference potential circuit is applied to the base of the other transistor. The reference potential applied to the base of the other transistor is applied to the base of a transistor of Darlington-connected transistors which receives an input signal, and the reference potential serves as a bias power source voltage.

10 Claims, 3 Drawing Sheets

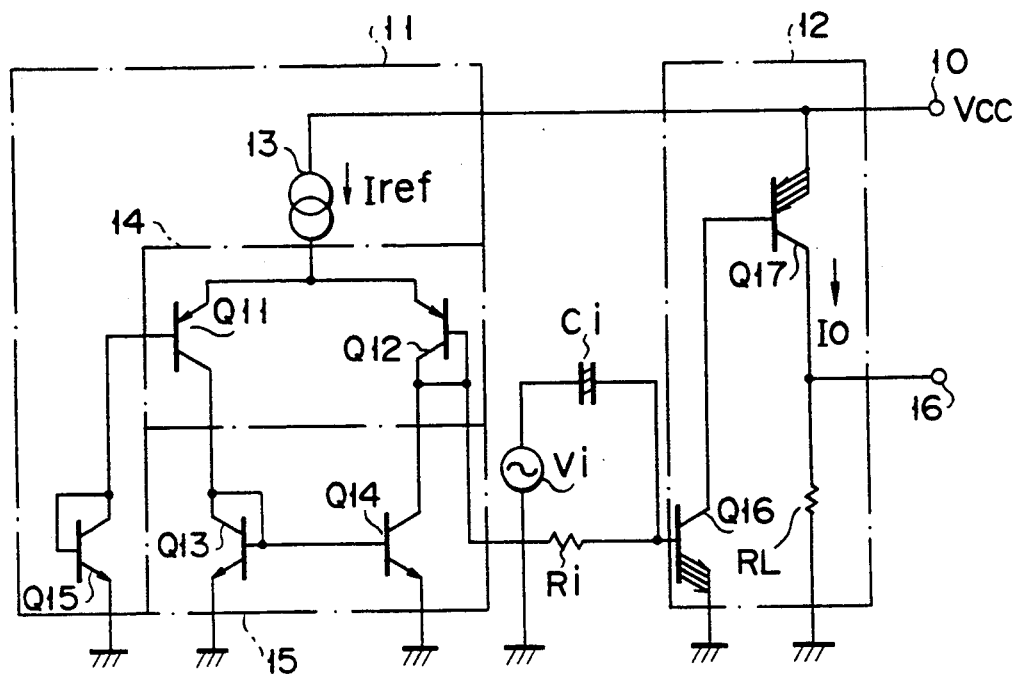
F I G. 1
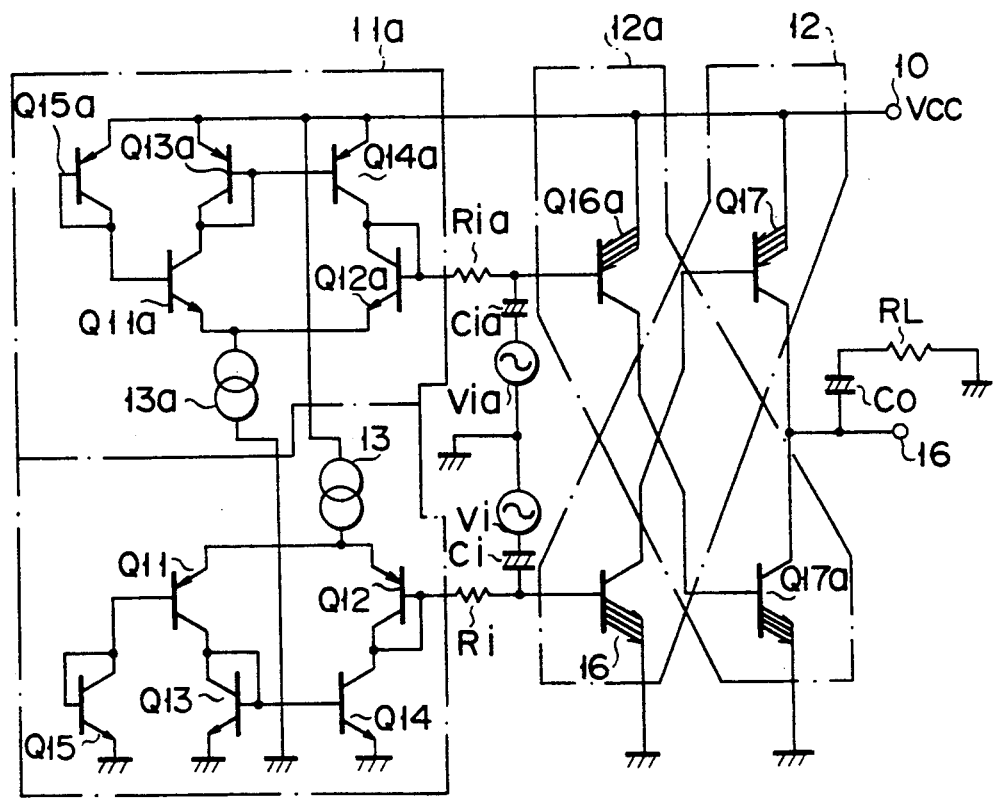
F I G. 2

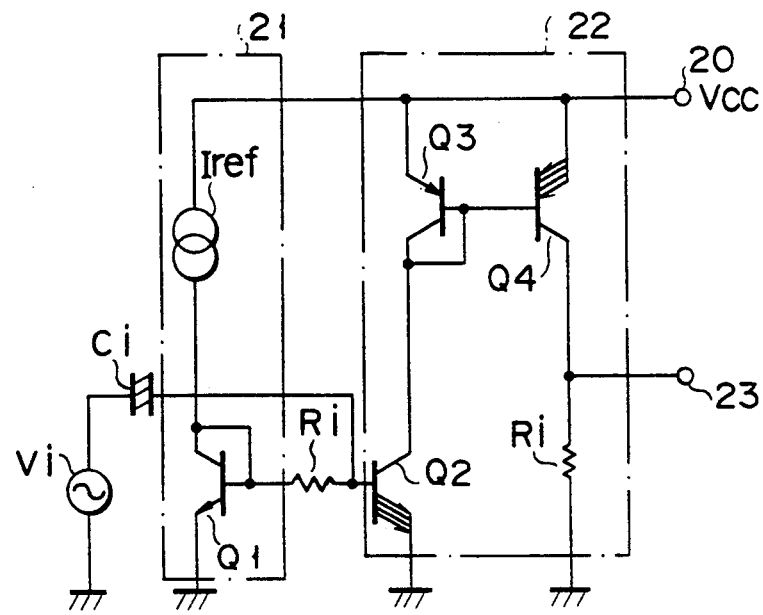
F I G. 4    (PRIOR ART)
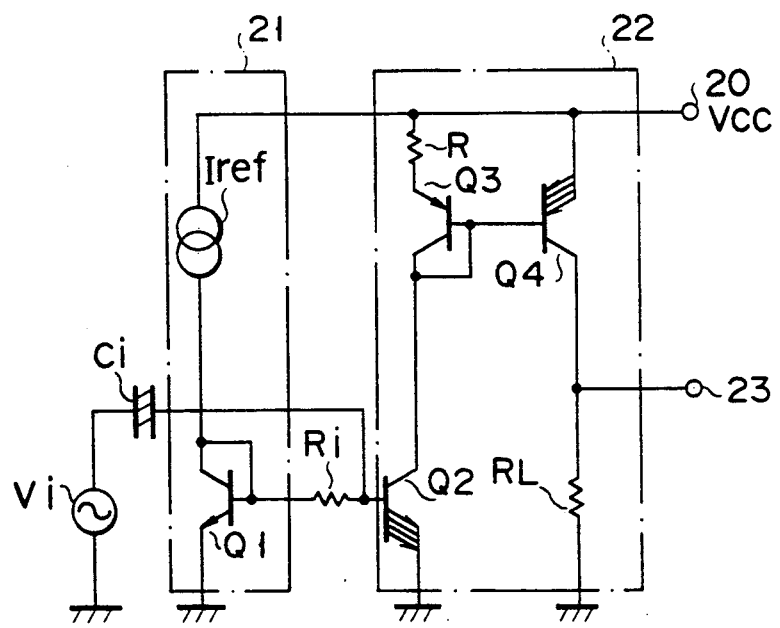
F I G. 5    (PRIOR ART)

REFERENCE VOLTAGE SOURCE CIRCUIT FOR A DARLINGTON CIRCUIT

BACKGROUND OF THE INVENTION

1. Field of the Invention

The present invention relates to a reference voltage source circuit used in a bipolar monolithic integrated circuit such as an audio circuit and, more particularly, to a reference voltage source circuit used for determining a current bias of an amplifier including inverted-Darlington-connected transistors.

2. Description of the Related Art

FIG. 4 is a view showing a current bias circuit of a conventional amplifier including inverted-Darlington-connected transistors.

A reference voltage source circuit 21 and an amplifier 22 are connected to a power source terminal 20 receiving a voltage Vcc. In the reference voltage source circuit 21, one terminal of a current source Iref is connected to the power source terminal 20, and the other terminal of the current source Iref is connected to the collector and base of a diode-connected npn transistor Q1. The emitter of the transistor Q1 is grounded, and the base of the transistor Q1 is connected to the base of an npn transistor Q2 through a resistor Ri. The npn transistor Q2 constitutes the amplifier 22. A signal source vi is connected to the base of the npn transistor Q2 through a coupling capacitor Ci.

In the amplifier 22, the base and collector of a diode-connected transistor Q3 are connected to the collector of the npn transistor Q2, and the emitter of the transistor Q3 is connected to the power source terminal 20. The base of the transistor Q3 is connected to the base of a pnp transistor Q4. The emitter of the transistor Q4 is connected to the power source terminal 20, and the collector of the transistor Q4 is connected to an output terminal 23 and grounded through a resistor $R_L$. The transistors Q1 and Q2, and the transistors Q3 and Q4 constitute current mirror circuits, respectively.

With the above arrangement, the electric characteristics of the transistors Q1 and Q2 are equal to each other, and the electric characteristics of the transistors Q3 and Q4 are equal to each other. When current gains of the transistors are relatively high, stable bias currents can be set.

An amplifier used as a current amplifier aiming at a low-voltage operation generally has a so-called inverted-Darlington arrangement in which the npn transistor Q2 and the pnp transistor Q4 are Darlington-connected to each other as described above. In addition, the transistor Q3 is connected to the transistor Q4 in consideration of a variation in current gain of the transistors used, thereby constituting a current mirror circuit.

When two transistors are Darlington-connected to each other, a current gain obtained by squaring a current gain of a single transistor can be obtained. However, as in the above circuit, when the transistor Q3 is connected between the transistors Q2 and Q4, the current gain cannot be increased.

FIG. 5 shows a prior art for increasing a current gain, and the reference numerals as in FIG. 4 denote the same parts in FIG. 5.

A resistor R is connected between the emitter of the transistor Q3 and a power source Vcc. A current flowing through the resistor R increases a current gain of the current mirror circuit constituted by the transistors Q3 and Q4. However, since input/output characteristics are not linear in this circuit, a distortion component is disadvantageously increased.

SUMMARY OF THE INVENTION

It is an object of the present invention to provide a reference voltage source circuit capable of biasing a current amplifier including Darlington-connected transistors with a high current gain and low distortion.

The object will be achieved by the following arrangement.

A reference voltage source circuit for supplying a bias current to a Darlington circuit constituted by first and second transistors, an input signal being supplied to the base of the first transistor, and the collector of the second transistor being connected to an output terminal, comprises:

third and fourth transistors of a first conductivity type constituting a differential amplifier and each having a base, a collector, and an emitter, the emitters being biased by a constant current;

a reference potential circuit, connected to the base of the third transistor, for generating a reference potential; and fifth and sixth transistors of a second conductivity type constituting a current mirror circuit and each having a base, a collector, and an emitter, the collectors of the fifth and sixth transistors being respectively connected to the collectors of the third and fourth transistors, and the fifth and sixth transistors supplying a reference potential serving as a reference bias generated by the reference potential circuit to the bases of the fourth and first transistors.

According to the present invention, the emitters of transistors constituting a differential amplifier are biased by a constant current. A current mirror circuit is connected to the collectors constituting the differential amplifier. A reference potential circuit is connected to the base of one transistor constituting the differential amplifier, and an output current from the current mirror circuit is fed back to the base of the other transistor. In addition, a voltage between the base of the other transistor and ground is applied to the base of a transistor of the Darlington-connected transistors which receives an input signal. The voltage serves as a bias power source. Therefore, since the transistor receiving the input signal can always be current-biased by a current corresponding to a base current from a transistor of the Darlington-connected transistors which is connected to an output terminal, a bias current from the output terminal can be set without decreasing an original current gain of the Darlington circuit. In addition, according to the present invention, a distortion component can be decreased. This is advantageous especially in a case wherein a reference voltage source circuit is constituted by a semiconductor integrated circuit.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a reference voltage source circuit according to the first embodiment of the present invention;

FIG. 2 is a circuit diagram showing a reference voltage source circuit according to the second embodiment of the present invention;

FIGS. 4 and 5 are circuit diagrams showing conventional reference voltage source circuits.

DETAILED DESCRIPTION OF THE PREFERRED EMBODIMENTS

Figure 3:
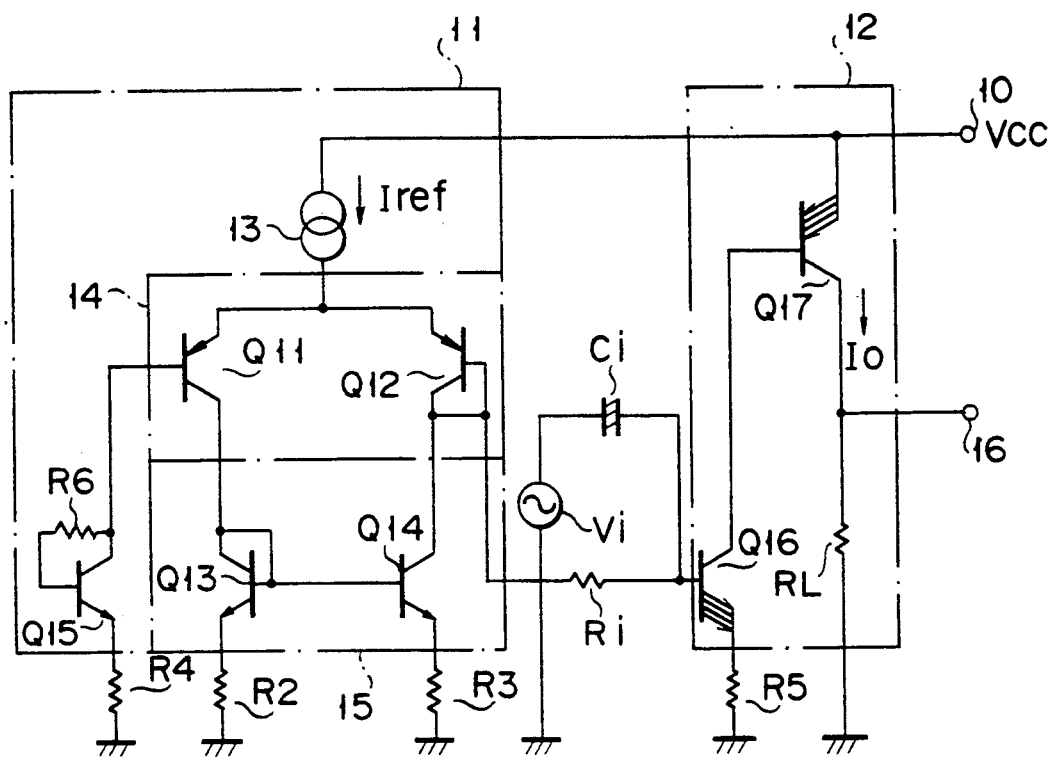
FIG. 3 is a circuit diagram showing a reference voltage source circuit according to the third embodiment of the present invention.

Embodiments of the present invention will be described below with reference to the accompanying drawings.

Referring to FIG. 1, a reference voltage source circuit 11 and an amplifier 12 biased by the reference voltage source circuit 11 are connected to a power source terminal 10 to which a power source voltage Vcc is applied.

In the reference voltage source circuit 11, one terminal of a constant current source 13 is connected to the power source terminal 10, and the other terminal is connected to the emitters of pnp transistors Q11 and Q12 constituting a differential amplifier 14. The base of the transistor Q11 is grounded through a diode-connected transistor Q15, and the collector of the transistor Q11 is connected to the collector and base of an npn transistor Q13 constituting a current mirror circuit 15 and to the base of a transistor Q14. The ratio of the emitter area of the transistor Q13 to the emitter area of the transistor Q14 is set to be 1:1, and the current ratio of the transistors Q13 to Q14 is set to be 1:1. The emitters of the transistors Q13 and Q14 are grounded, and the collector of the transistor Q14 is connected to the collector and base of the transistor Q12. The base of the transistor Q12 is connected to the base of an npn transistor Q16 through a resistor Ri, and the npn transistor Q16 constitutes the amplifier 12. The base of the transistor Q12 is connected to a signal source vi through a coupling capacitor Ci. The transistor Q16 is inverted-Darlington-connected to a pnp transistor Q17. That is, the emitter of the transistor Q16 is grounded, and the collector of the transistor Q16 is connected to the base of the transistor Q17. The emitter of the transistor Q17 is connected to the power source terminal 10, and the collector of the transistor Q17 is connected to an output terminal 16 and grounded through a resistor $R_L$.

In the above circuit, current mirror circuit 15 formed by transistors Q13 and Q14 is connected to the collectors of transistors Q11 and Q12, and what is called a one-sided output differential amplifier is formed, with the collector of transistor Q11 serving as its output terminal. The output current of transistor Q11 is completely fed back to the base of transistor Q12 through current mirror circuit 15. Consequently, transistors Q12, Q13 and Q14 constitute a voltage follower circuit. Therefore, a current of ½ a constant current Iref output from the constant current source 13 is supplied to the collector of the transistor Q11, and a base-emitter voltage of the transistor Q15 biased by the base current from the transistor Q11 can be obtained from the base of the transistor Q12.

When the ratio of the emitter area of the npn transistor Q15 to the emitter area of the transistor Q16 is set to be 1:n, and the current gain of a pnp transistor is set to be p, an output bias current Io of the amplifier 12 is given by the following equation:

$$Io = Iref/2 \times 1/\beta p \times n \times \beta p$$
$$= Iref \cdot n/2$$

The current gain of the pnp transistor Q17 of the amplifier 12 must be equal to the current gains of the pnp transistors Q11 and Q12 of the reference voltage source circuit 11. Therefore, the ratios of the emitter areas of the transistors Q11 and Q12 to the emitter area of the transistor Q17 are preferably set to be 1:n.

With the above embodiment, the current mirror circuit 15 constituted by the npn transistors Q13 and Q14 is connected to the collectors of the pnp transistors Q11 and Q12 constituting a differential amplifier, and an output from the current mirror circuit 15 is fed back to the base of the transistor Q12, thereby constituting a voltage follower. In addition, the diode-connected transistor Q15 forming a reference potential circuit is connected to the base of the transistor Q11, the transistor Q15 is current-biased by the base current of the transistor Q11, and the base-emitter voltage of the transistor Q15 is applied to the base of the transistor Q16 of the amplifier 12 through the voltage follower. Therefore, since a conventional transistor constituting a current mirror is not interposed between the transistors Q16 and Q17, a normal current gain from a Darlington circuit can be obtained.

According to the above arrangement, a conventional resistor for causing the transistor Q17 not to respond until a current flowing through the transistor Q16 becomes a specific current is not interposed between the transistors Q16 and Q17 which are Darlington-connected to each other. Therefore, the transistor Q17 responds to a current gain of the current of the transistor Q16 according to a change in current of the transistor Q16. For this reason, input/output characteristics of the transistors Q16 and Q17 become linear, thereby decreasing a distortion component.

FIG. 2 shows the second embodiment of the present invention, in which the present invention is applied to a Class B amplifier.

In this embodiment, first and second reference voltage source circuits 11 and 11a constituted by transistors having different conductivities and first and second amplifiers 12 and 12a having inverted-Darlington circuits constituted by transistors having different conductivities are combined. A capacitor Co and a load resistor $R_L$ are connected to an output terminal 16.

The same reference numerals as in FIG. 1 denote the same parts in FIG. 2. In the second reference voltage source circuit 11a and the second amplifier 12a, reference symbols a are suffixed to the reference numerals of the parts corresponding to the parts of the first reference voltage source circuit 11 and the first amplifier 12.

When the Class B amplifier is arranged as described above, an amplifier can be operated at a relatively low voltage. In addition, the amplifier has, small variation in bias current, i.e., idle current, in the output stage.

FIG. 3 shows the third embodiment of the present invention. The same reference numerals as in FIG. 1 denote the same parts in FIG. 3.

Referring to FIG. 3, a resistor R2 is connected between the emitter of the transistor Q13 and ground, and a resistor R3 is connected between the emitter of the transistor Q14 and ground. The resistors R2 and R3 have the same resistance. The resistors R2 and R3 correct the variations in forward bias DC voltages VF of the transistors Q13 and Q14. When a plurality of transistors are manufactured in a semiconductor integrated circuit, resistors having the same resistance can be formed easier than transistors having the same condition such as the same emitter area ratio. With the above arrangement, a variation in precision of the transistors Q13 and Q14 can be easily corrected by the resistors R2 and R3.

A resistor R4 is connected between the emitter of a transistor Q15 and ground, and a resistor R5 is connected between the emitter of the transistor Q16 and ground. The relationship between the resistances of the resistors R4 and R5 corresponds to a ratio of their emitter areas, i.e., R4:R5=1:n (n is an integer). With the above arrangement, variations in forward bias DC voltages VF of the transistors Q15 and Q16 can be corrected by the resistors R4 and R5.

In addition, a resistor R6 is connected between the base and collector of the transistor Q15. The resistance of the resistor R6 corresponds to a ratio of the emitter area of the transistor Q16 to the emitter area of the transistor Q15 and is set to be n (n is an integer) times the resistance of a resistor Ri. The resistor R6 is used for correcting a voltage drop caused by the resistor Ri connected to the base of the transistor Q16. That is, the base-emitter voltage of the transistor Q15 is applied to the base of the transistor Q16. However, the resistor Ri is connected to the base of the transistor Q16. For this reason, the base voltage of the transistor Q16 is not equal to the base-emitter voltage of the transistor Q15. The resistor R6 is connected between the base and collector of the transistor Q15, thereby correcting the voltage drop caused by the resistor Ri connected to the base of the transistor Q16.

Note that the present invention is not limited to the above embodiments, and various changes and modifications may be effected without departing from the spirit and scope of the invention.

What is claimed is:

1. A reference voltage source circuit for supplying a bias current to an inverted Darlington circuit including a first transistor of a first conductivity type and a second transistor of a second conductivity type, an input signal supplied to a base of said second transistor, and said first transistor having a collector connected to an output terminal, comprising:
   a differential amplifier including third and fourth transistors of said first conductivity type, each having a base, a collector, and an emitter, said emitters of said third and fourth transistors being biased by a constant current, wherein said second transistor has an emitter area that is an integer multiple of each of emitter areas of said third and fourth transistors;
   a reference potential circuit, connected to the base of said third transistor, for generating a reference potential; and
   a current mirror circuit including fifth and sixth transistors of said second conductivity type, each having a base, a collector, and an emitter, the collectors of said fifth and sixth transistors being respectively connected to the collectors of said third and fourth transistors, and said fifth and sixth transistors controlling the bases of said fourth and second transistors in accordance with the reference potential generated by said reference potential circuit.

2. A reference voltage source circuit for supplying a bias current to an inverted Darlington circuit including a first transistor of a first conductivity type and a second transistor of a second conductivity type, an input signal supplied to a base of said second transistor, and said first transistor having a collector connected to an output terminal, comprising:
   a differential amplifier including third and fourth transistors of said first conductivity type, each having a base, a collector, and an emitter, said emitters of said third and fourth transistors being biased by a constant current;
   a reference potential circuit, connected to the base of said third transistor and including a diode-connected transistor having an emitter area, for generating a reference potential, wherein said first transistor has an emitter area that is an integer multiple of said emitter area of said diode-connected transistor; and
   a current mirror circuit including fifth and sixth transistors of said second conductivity type, each having a base, a collector, and an emitter, the collectors of said fifth and sixth transistors being respectively connected to the collectors of said third and fourth transistors, and said fifth and sixth transistors controlling the bases of said fourth and second transistors in accordance with the reference potential generated by said reference potential circuit.

3. A circuit according to claim 2, wherein resistors are respectively connected between the emitter of said fifth transistor and a ground and between the emitter of said sixth transistor and the ground, said resistors having substantially the same resistance.

4. A circuit according to claim 1, wherein resistors are respectively connected between the emitter of said fifth transistor and a ground and between the emitter of said sixth transistor and the ground, said resistors having substantially the same resistance.

5. A reference voltage source circuit for supplying a bias current to a Darlington circuit including first and second transistors, an input signal being supplied to a base of said first transistor, and said second transistor having a collector connected to an output terminal, comprising:
   a differential amplifier including third and fourth transistors of a first conductivity type, each having a base, a collector, and an emitter;
   a constant current source, connected to the emitters of said third and fourth transistors, for biasing said third and fourth transistors;
   a reference potential circuit, connected to the base of said third transistor, for generating a reference potential; and
   a current mirror circuit including fifth and sixth transistors of a second conductivity type, each having a base, a collector, and an emitter, the collector and base of said fifth transistor being connected to the collector of said third transistor, the collector of said fifth transistor being connected to the collector and base of said fourth transistor, and the emitters of said fifth and sixth transistors being grounded; and
   resistor means, connected between the bases of said fourth and first transistors, for supplying a voltage serving as a reference bias between the base of said fourth transistor and a ground potential to the base of said first transistor.

6. A circuit according to claim 5, wherein an emitter area of said second transistor is an integer multiple of each of emitter areas of said third and fourth transistors.

7. A circuit according to claim 5, wherein said reference potential circuit includes a seventh diode-connected transistor, and an emitter area of said first transistor is an integer multiple of an emitter area of said seventh transistor.

8. A circuit according to claim 5, wherein resistors are respectively connected between the emitter of said fifth transistor and ground and between the emitter of said sixth transistor and ground, said resistors having substantially the same resistance.

9. A circuit according to claim 7, further comprising a resistor connected between the base and collector of said seventh transistor, said resistor having a resistance that corresponds to a ratio of an emitter area of said first transistor to an emitter area of said seventh transistor.

10. A reference voltage source circuit for supplying a bias voltage to first and second Darlington circuits, said first Darlington circuit including a first transistor of a first conductivity type having a base receiving a first input signal and a second transistor of a second conductivity type having a collector connected to an output terminal, and said second Darlington circuit including a third transistor of the second conductivity type having a base receiving a second input signal and a fourth transistor of the first conductivity type having a collector connected to said output terminal, comprising:

a differential amplifier including fifth and sixth transistors of the second conductivity type, each having a base, a collector, and an emitter, said emitters of said fifth and sixth transistors being biased by a first constant current;

a first reference potential circuit, connected to the base of said fifth transistor, for generating a first reference potential;

a current mirror circuit including seventh and eighth transistors of the first conductivity type, each having a base, a collector, and an emitter, the collectors of said seventh and eighth transistors being connected to the collectors of said fifth and sixth transistors, said eighth transistor having an output current supplied to the base of said sixth transistor;

first resistor means for supplying a voltage serving as a reference bias between the base of said sixth transistor and a first potential to the base of said first transistor;

a differential amplifier including ninth and tenth transistors of the first conductivity type, each having a base, a collector, and an emitter, said emitters of said ninth and tenth transistors being biased by a second constant current;

a second reference potential circuit, connected to the base of said ninth transistor, for generating a second reference potential;

a current mirror circuit including eleventh and twelfth transistors of the second conductivity type, each having a base, a collector, and an emitter, the collectors of said eleventh and twelfth transistors being connected to the collectors of said ninth and tenth transistors, said twelfth transistor having an output current supplied to the base of said tenth transistor; and second resistor means for supplying a voltage serving as a reference bias between the base of said tenth transistor and a second potential to the base of said third transistor.

* * * * *